US009490376B2

(12) United States Patent
Joe et al.

(10) Patent No.: US 9,490,376 B2
(45) Date of Patent: Nov. 8, 2016

(54) SOLAR CELL MODULE

(75) Inventors: Jin Hyoun Joe, Seoul (KR); Junghoon Choi, Seoul (KR); Kwangsun Ji, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 13/617,784

(22) Filed: Sep. 14, 2012

(65) Prior Publication Data

US 2013/0081675 A1   Apr. 4, 2013

(30) Foreign Application Priority Data

Sep. 29, 2011  (KR) .................. 10-2011-0098998
Sep. 29, 2011  (KR) .................. 10-2011-0099000

(51) Int. Cl.
| H01L 31/042 | (2014.01) |
| H01L 31/0224 | (2006.01) |
| H01L 31/05 | (2014.01) |
| H01L 31/068 | (2012.01) |
| H01L 31/0747 | (2012.01) |

(52) U.S. Cl.
CPC ... *H01L 31/022441* (2013.01); *H01L 31/0516* (2013.01); *H01L 31/0682* (2013.01); *H01L 31/0747* (2013.01); *Y02E 10/547* (2013.01)

(58) Field of Classification Search
CPC .................. H01L 31/022441; H01L 31/0516; H01L 31/0747; H01L 31/0682
USPC ................................ 136/243–293
See application file for complete search history.

(56) References Cited

U.S. PATENT DOCUMENTS

| 5,951,786 | A | 9/1999 | Gee et al. | |
| 2005/0172996 | A1* | 8/2005 | Hacke et al. ................. | 136/256 |
| 2005/0268959 | A1* | 12/2005 | Aschenbrenner et al. ... | 136/244 |
| 2009/0038675 | A1 | 2/2009 | Tsunomura et al. | |
| 2010/0018565 | A1 | 1/2010 | Funakoshi | |
| 2010/0051085 | A1* | 3/2010 | Weidman et al. ............ | 136/244 |

(Continued)

FOREIGN PATENT DOCUMENTS

| EP | 2 081 237 A2 | 7/2009 |
| JP | 2006-324590 A | 11/2006 |

(Continued)

OTHER PUBLICATIONS

Gee et al., "Simplified module assembly using back-contact crystalline-silicon solar cells", Conference Record of the 26th IEEE Photovoltaic Specialists Conference (1997).

*Primary Examiner* — Tamir Ayad
*Assistant Examiner* — Uyen Tran
(74) *Attorney, Agent, or Firm* — Birch, Stewart, Kolasch & Birch, LLP

(57) ABSTRACT

A solar cell module according to an embodiment of the invention includes a plurality of solar cells each including a substrate, a first electrode current collector which is positioned at a first edge of a back surface of the substrate and extends in a first direction, and a second electrode current collector which is positioned at a second edge of the back surface of the substrate and extends in the first direction, a conductive adhesive film contacting a first electrode current collector of a first solar cell of the plurality of solar cells, or a second electrode current collector of a second solar cell adjacent to the first solar cell, or both, and an interconnector which contacts the conductive adhesive film and electrically connects the adjacent first and second solar cells to each other.

15 Claims, 12 Drawing Sheets

(56) References Cited

U.S. PATENT DOCUMENTS

| | | | |
|---|---|---|---|
| 2010/0108141 A1* | 5/2010 | Fukushima et al. | 136/256 |
| 2010/0263705 A1 | 10/2010 | Ide et al. | |
| 2011/0073165 A1* | 3/2011 | Lee | 136/251 |
| 2011/0114179 A1 | 5/2011 | Funakoshi | |
| 2012/0103408 A1* | 5/2012 | Moslehi et al. | 136/256 |
| 2012/0204938 A1* | 8/2012 | Hacke et al. | 136/246 |

FOREIGN PATENT DOCUMENTS

| | | |
|---|---|---|
| JP | 2008-502149 A | 1/2008 |
| JP | 2008-300403 A | 12/2008 |
| JP | 2009-130116 A | 6/2009 |
| JP | 2009-302327 A | 12/2009 |
| JP | 2010-251667 A | 11/2010 |
| JP | 2012-84560 A | 4/2012 |
| JP | 2013-73971 A | 4/2013 |
| KR | 10-2010-0123162 A | 11/2010 |
| KR | 10-2010-0123163 A | 11/2010 |
| KR | 10-2011-0034183 A | 4/2011 |
| KR | 10-1045860 B1 | 7/2011 |
| WO | 2008/090718 A1 | 7/2008 |

* cited by examiner

SOLAR CELL MODULE

This application claims priority to and the benefit of Korean Patent Application No. 10-2011-0098998 and Korean Patent Application No. 10-2011-0099000 filed in the Korean Intellectual Property Office on Sep. 29, 2011, the entire contents of which are incorporated herein by reference.

BACKGROUND OF THE INVENTION

1. Field of the Invention

Embodiments of the invention relate to a solar cell module.

2. Description of the Related Art

Recently, as existing energy sources such as petroleum and coal are expected to be depleted, interests in renewable energy sources for replacing the existing energy sources are increasing. As a renewable energy source, solar cells to generate electric energy from solar energy have been particularly spotlighted. A back contact solar cell, in which both an electron electrode and a hole electrode are formed on a back surface of a substrate (i.e., the surface of the substrate on which light is not incident), has been recently developed to increase a light receiving area and improve its efficiency.

The plurality of back contact solar cells each having the above-described structure are connected in series or parallel to one another to manufacture a moisture-proof solar cell module in a panel form, thereby obtaining a desired output.

SUMMARY OF THE INVENTION

In one aspect, there is a solar cell module including a plurality of solar cells each including a substrate, a first electrode current collector which is positioned at a first edge of a back surface of the substrate and extends in a first direction, and a second electrode current collector which is positioned at a second edge of the back surface of the substrate and extends in the first direction, a conductive adhesive film configured to contact a first electrode current collector of a first solar cell of the plurality of solar cells, or a second electrode current collector of a second solar cell adjacent to the first solar cell, or both, an interconnector configured to contact the conductive adhesive film and electrically connect the adjacent first and second solar cells to each other, a front encapsulant and a back encapsulant configured to protect the plurality of solar cells, a transparent member positioned on the front encapsulant on front surfaces of the substrates of the plurality of solar cells, and a back sheet positioned under the back encapsulant on the back surfaces of the substrates of the plurality of solar cells.

Each of the plurality of solar cells may be a back contact solar cell. The substrate of the back contact solar cell may be a crystalline semiconductor substrate. The back contact solar cell may include an emitter region and a back surface field (BSF) region at the back surface of the substrate.

The back contact solar cell may further include a plurality of first electrodes, of which first ends are connected to one another using the first electrode current collector, and a plurality of second electrodes, of which first ends are connected to one another using the second electrode current collector. The plurality of first electrodes and the plurality of second electrodes may be alternately positioned. The plurality of first electrodes may contact the emitter region, and the plurality of second electrodes may contact the back surface field region.

As one example, the conductive adhesive film may include a first conductive adhesive film contacting the first electrode current collector of the first solar cell and a second conductive adhesive film contacting the second electrode current collector of the second solar cell. The interconnector may contact both the first conductive adhesive film and the second conductive adhesive film.

A width of the first conductive adhesive film may be equal to or less than a width of the first electrode current collector, and a width of the second conductive adhesive film may be equal to or less than a width of the second electrode current collector.

A length of the first conductive adhesive film may be equal to or less than a length of the first electrode current collector, and a length of the second conductive adhesive film may be equal to or less than a length of the second electrode current collector.

Each of the plurality of solar cells may further include a plurality of first electrodes extending in a second direction perpendicular to the first direction and a plurality of second electrodes, each of which is positioned between the first electrodes and extends in the second direction. First ends of the plurality of first electrodes may be connected to the first electrode current collector, and first ends of the plurality of second electrodes may be connected to the second electrode current collector. The first conductive adhesive film may not contact the plurality of first electrodes, and the second conductive adhesive film may not contact the plurality of second electrodes.

A length of the interconnector may be equal to or less than a length of the first conductive adhesive film and a length of the second conductive adhesive film.

A width of the interconnector may be greater than a distance between adjacent ends of the first conductive adhesive film and the second conductive adhesive film.

As another example, the conductive adhesive film may include a conductive adhesive film contacting the first electrode current collector of the first solar cell and the second electrode current collector of the second solar cell, and extending from the first electrode current collector to the second electrode current collector. The interconnector may contact the conductive adhesive film.

A width of the conductive adhesive film may be equal to or greater than a width of the interconnector. A length of the interconnector may be equal to or less than a length of the conductive adhesive film.

Each of the plurality of solar cells may further include a plurality of first electrodes extending in a second direction perpendicular to the first direction and a plurality of second electrodes, each of which is positioned between the first electrodes and extends in the second direction. First ends of the plurality of first electrodes may be connected to the first electrode current collector, and first ends of the plurality of second electrodes may be connected to the second electrode current collector. The conductive adhesive film may not contact the plurality of first electrodes and the plurality of second electrodes.

A spacer may be positioned between the adjacent first and second solar cells. The conductive adhesive film may have a groove in which a portion of the spacer is buried.

The spacer may be positioned between the substrates of the adjacent first and second solar cells. Alternatively, the spacer may be positioned between the first electrode current collector of the first solar cell and the second electrode current collector of the second solar cell. Alternatively, the spacer may be positioned between the substrates of the adjacent first and second solar cells and between the first electrode current collector of the first solar cell and the second electrode current collector of the second solar cell.

When the spacer is positioned between the substrates of the adjacent first and second solar cells, the front encapsulant or the back encapsulant may be filled in a space between the spacer and the interconnector.

When the spacer is positioned between the first electrode current collector of the first solar cell and the second electrode current collector of the second solar cell, the front encapsulant or the back encapsulant may be filled in a space between the substrates of the adjacent first and second solar cells.

The spacer may have substantially the same thickness as the substrate of each solar cell. Alternatively, the spacer may have a thickness corresponding to a sum of thicknesses of the current collector and the conductive adhesive film. Alternatively, the spacer may have a thickness corresponding to a sum of thicknesses of the substrate, the current collector, and the conductive adhesive film.

When the spacer has substantially the same thickness as the substrate of each solar cell, the front encapsulant or the back encapsulant may be filled in the space between the spacer and the interconnector.

When the spacer has the thickness corresponding to a sum of thicknesses of the current collector and the conductive adhesive film, the front encapsulant or the back encapsulant may be filled in the space between the substrates of the adjacent first and second solar cells.

Unlike this, the conductive adhesive film may include a space supporter performing a function similar to the spacer. The conductive adhesive film and the space supporter may form an integral body. The integral formation means the space supporter is formed of the same material as the conductive adhesive film.

According to the above-described characteristics of the solar cell module, the first and second electrode current collectors may be directly connected to the interconnector using the conductive adhesive film. Therefore, a tabbing process may be performed at a low temperature, for example, about 140° C. to 180° C.

In the back contact solar cell having the heterojunction structure, because the emitter region and the back surface field region are formed of amorphous silicon, the emitter region and the back surface field region are easily damaged when a high temperature is applied to the emitter region and the back surface field region in the tabbing process. However, because the tabbing process is performed at a lower temperature in the back contact solar cell according to the embodiment of the invention, the emitter region and the back surface field region formed of amorphous silicon may be prevented from being damaged.

A thin substrate may be used in the solar cell module. For example, when a thickness of the substrate is about 200 μm, a warp amount of the substrate is equal to or greater than about 2.1 mm in a related art tabbing process for melting flux using a hot air. On the other hand, a warp amount of the substrate is about 0.5 mm in the tabbing process using the conductive adhesive film.

The warp amount of the substrate may be expressed by a difference between heights of a middle portion and a peripheral portion of the back surface of the substrate.

The warp amount of the substrate increases as the thickness of the substrate decreases. For example, the thickness of the substrate is about 80 μm, the warp amount of the substrate is equal to or greater than about 14 mm in the related art tabbing process. On the other hand, the warp amount of the substrate is about 1.8 mm in the tabbing process using the conductive adhesive film.

When the warp amount of the substrate exceeds a predetermined value, for example, about 2.5 mm, a crack may be generated in the substrate or bubbles may be generated in the solar cell module in a subsequent lamination process. Therefore, it is impossible to use a thin substrate in the solar cell module manufactured using the related art tabbing process.

On the other hand, the tabbing process using the conductive adhesive film may greatly reduce the warp amount of the substrate, compared with the related art tabbing process. Hence, the thin substrate may be used in the solar cell module.

For example, the substrate having the thickness of about 80 μm to 180 μm may be used in the tabbing process using the conductive adhesive film. Thus, the material cost may be reduced because of a reduction in the thickness of the substrate.

The related art tabbing process may generate the crack at an interface between the current collectors and the interconnector or a peeling phenomenon between several materials inside a solder of the interconnector, thereby reducing the output of the solar cell module. On the other hand, the tabbing process using the conductive adhesive film may solve the above-described problems. Thus, the reliability of the solar cell module is improved.

Because a thermal stress applied to the interconnector is absorbed by the conductive adhesive film, a damage of the electrical connection between the interconnector and the current collectors resulting from the thermal stress may be prevented or reduced. Hence, the reliability and the durability of the solar cell module may be further improved.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
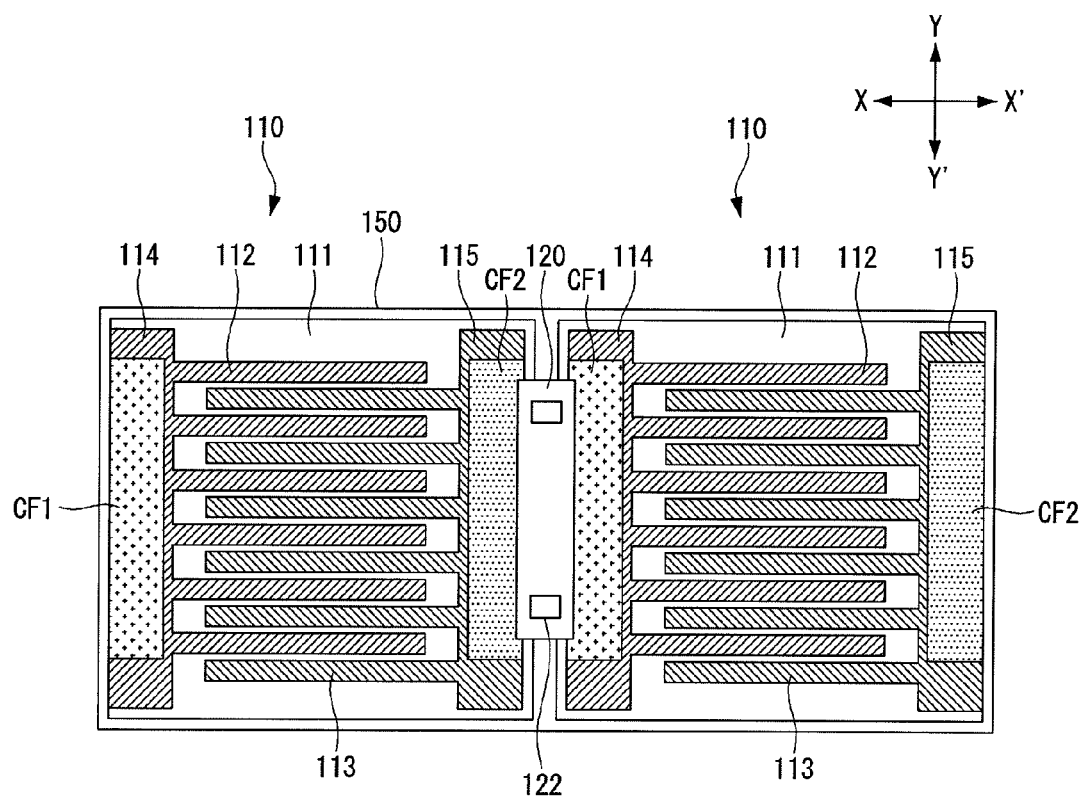
FIG. 1 is a plane view of a solar cell module according to a first embodiment of the invention in a state where a back sheet of the solar cell module is removed.

Embodiments of the invention will be described more fully hereinafter with reference to the accompanying drawings, in which example embodiments of the invention are shown. This invention may, however, be embodied in many different forms and should not be construed as limited to the embodiments set forth herein. In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present.

In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

Example embodiments of the invention will be described in detail with reference to FIGS. 1 to 15.

Figure 2:
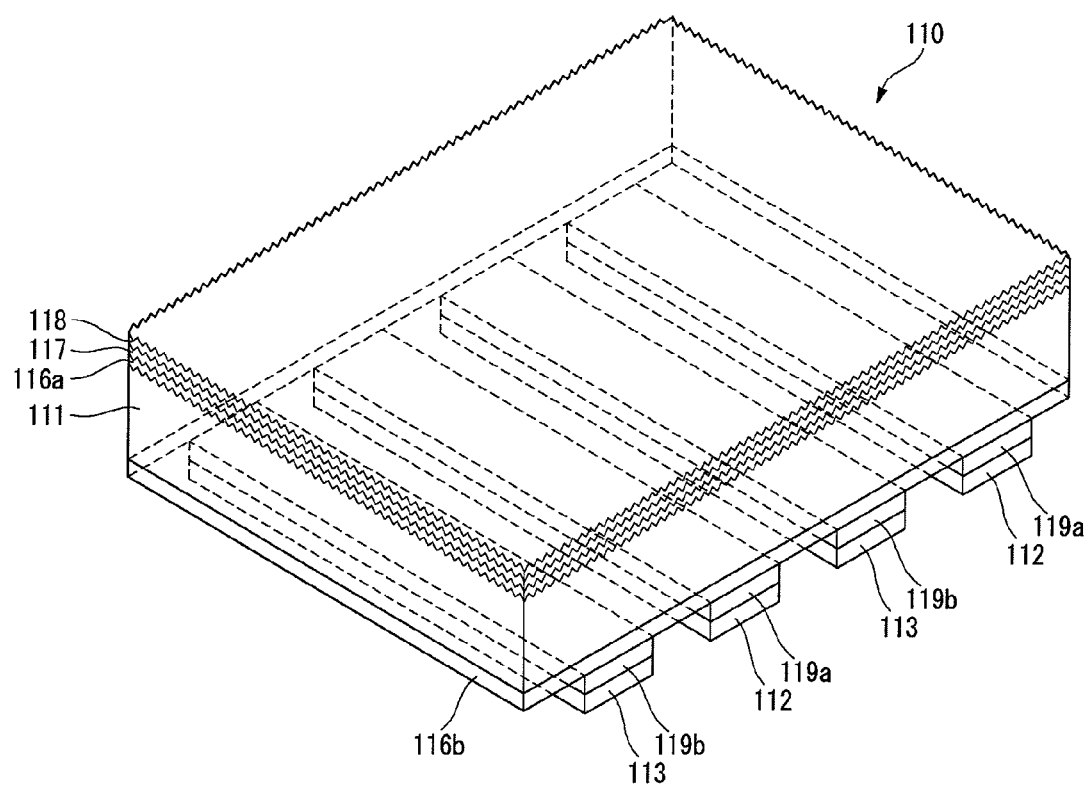
FIG. 2 is a perspective view of a configuration of a back contact solar cell used in a solar cell module according to an example embodiment of the invention.
Figure 3:
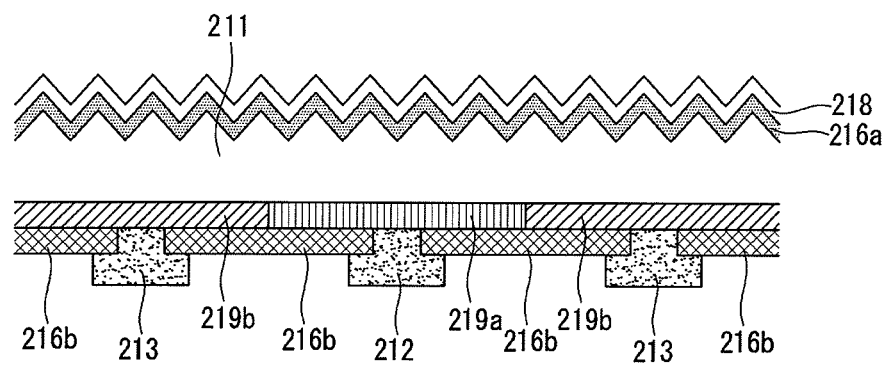
FIG. 3 is a cross-sectional view of a configuration of a back contact solar cell used in a solar cell module according to another example embodiment of the invention.
Figure 4:
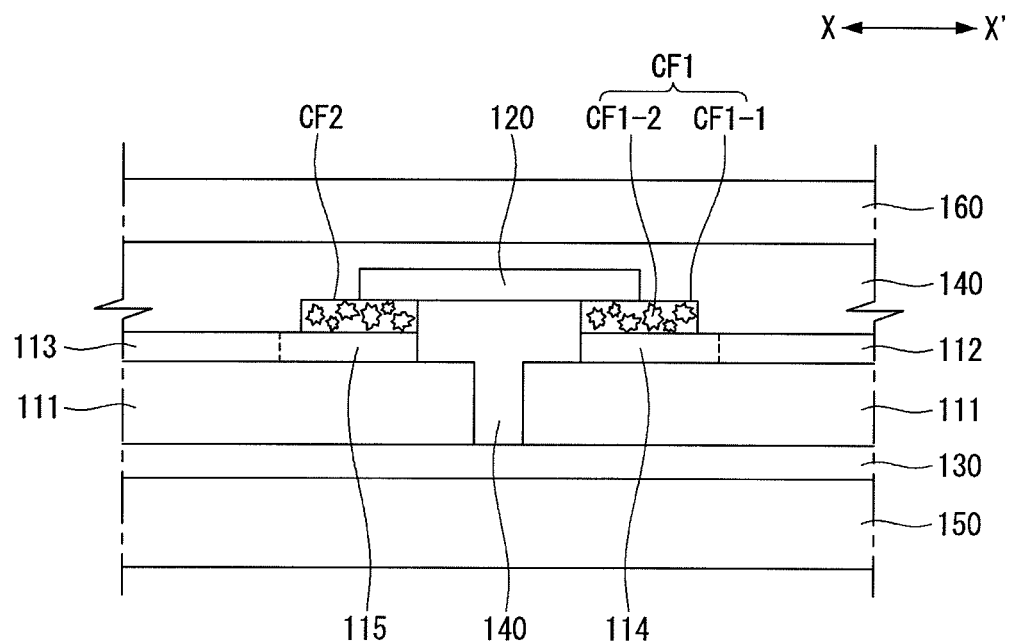
FIG. 4 is a partial cross-sectional view of the solar cell module according to the first embodiment of the invention.

A solar cell module according to a first embodiment of the invention is described in detail with reference to FIGS. 1 to 3. FIG. 1 is a plane view of a solar cell module according to a first embodiment of the invention in a state where a back sheet of the solar cell module is removed. FIG. 2 is a perspective view of a configuration of a back contact solar cell used in a solar cell module according to an example embodiment of the invention. FIG. 3 is a cross-sectional view of a configuration of a back contact solar cell used in a solar cell module according to another example embodiment of the invention. FIG. 4 is a partial cross-sectional view of the solar cell module according to the first embodiment of the invention.

The solar cell module according to the first embodiment of the invention includes a plurality of back contact solar cells 110, an interconnector 120 which is positioned on back surfaces of the back contact solar cells 110 and electrically connects the adjacent back contact solar cells 110 to each other, a front encapsulant 130 and a back encapsulant 140 for protecting the back contact solar cells 110, a transparent member 150 which is positioned on the front encapsulant 130 on light receiving surfaces of the back contact solar cells 110, and a back sheet 160 which is positioned under the back encapsulant 140 on surfaces opposite the light receiving surfaces of the back contact solar cells 110.

Although FIGS. 1 and 4 show only the two back contact solar cells 110, the number of back contact solar cells 110 is not limited thereto.

As shown in FIG. 2, each of the back contact solar cells 110 used in the solar cell module includes a crystalline semiconductor substrate 111, a front protective layer 116a positioned on an incident surface (hereinafter, referred to as "a front surface") of the crystalline semiconductor substrate 111 on which light is incident, a front surface field (FSF) region 117 positioned at the front protective layer 116a, an anti-reflection layer 118 positioned on the FSF region 117, a back protective layer 116b positioned on a surface (hereinafter, referred to as "a back surface"), opposite the incident surface of the crystalline semiconductor substrate 111, on which light is not incident, a plurality of first amorphous silicon layers 119a positioned on the back protective layer 116b, a plurality of second amorphous silicon layers 119b which are positioned on the back protective layer 116b to be separated from the plurality of first amorphous silicon layers 119a, a plurality of first electrodes 112 and a first electrode current collector 114 (refer to FIG. 1) positioned on the plurality of first amorphous silicon layers 119a, and a plurality of second electrodes 113 and a second electrode current collector 115 (refer to FIG. 1) positioned on the plurality of second amorphous silicon layers 119b.

FIG. 2 shows the back contact solar cell 110 including the FSF region 117, the second amorphous silicon layers 119b, and the back protective layer 116b. However, the FSF region 117, the second amorphous silicon layers 119b, and the back protective layer 116b may be omitted, if desired.

Each of the first amorphous silicon layers 119a serves as an emitter region, and each of the second amorphous silicon layers 119b serves as a back surface field (BSF) region. Thus, the first amorphous silicon layer 119a is hereinafter referred to as the emitter region, and the second amorphous silicon layer 119b is hereinafter referred to as the BSF region.

The crystalline semiconductor substrate 111 is the substrate formed of first conductive type silicon, for example, n-type silicon. Silicon used in the crystalline semiconductor substrate 111 may be crystalline silicon such as single crystal silicon and polycrystalline silicon.

When the crystalline semiconductor substrate 111 is of the n-type, the crystalline semiconductor substrate 111 may be doped with impurities of a group V element such as phosphorus (P), arsenic (As), and antimony (Sb).

Alternatively, the crystalline semiconductor substrate 111 may be of a p-type, and/or be formed of semiconductor materials other than silicon. When the crystalline semiconductor substrate 111 is of the p-type, the crystalline semiconductor substrate 111 may be doped with impurities of a group III element such as boron (B), gallium (Ga), and indium (In).

The front surface of the crystalline semiconductor substrate 111 may be textured to form a textured surface corresponding to an uneven surface or having uneven characteristics.

FIG. 2 shows that only edges of the crystalline semiconductor substrate 111, the front protective layer 116a, the FSF region 117, and the anti-reflection layer 118 have the textured surface for the sake of brevity. However, the entire front surface of each of the crystalline semiconductor substrate 111, the front protective layer 116a, the FSF region 117, and the anti-reflection layer 118 substantially has the textured surface.

The front protective layer 116a positioned on the front surface of the crystalline semiconductor substrate 111 may be formed using one of intrinsic amorphous silicon (a-Si), silicon nitride (SiNx), and silicon oxide (SiOx).

The front protective layer 116a performs a passivation function which converts a defect, for example, dangling bonds existing at and around the surface of the crystalline semiconductor substrate 111 into stable bonds to thereby prevent or reduce a recombination and/or a disappearance of carriers moving to the surface of the crystalline semiconductor substrate 111. Hence, the front protective layer 116a reduces an amount of carriers lost by the defect at and around the surface of the crystalline semiconductor substrate 111.

When a thickness of the front protective layer 116a is equal to or greater than about 1 nm, the front protective layer 116a is uniformly coated on the front surface of the crystalline semiconductor substrate 111, thereby smoothly performing the passivation function. When the thickness of the front protective layer 116a is equal to or less than about 30 nm, an amount of light absorbed in the front protective layer 116a is reduced. Hence, an amount of light incident on the crystalline semiconductor substrate 111 may increase. Thus, the front protective layer 116a may have the thickness of about 1 nm to 30 nm.

The FSF region 117 positioned at the front protective layer 116a is a region which is more heavily doped than the crystalline semiconductor substrate 111 with impurities of the same conductive type (for example, the n-type) as the crystalline semiconductor substrate 111. An impurity concentration of the FSF region 117 may be about $10^{10}$ to $10^{21}$ atoms/cm$^3$.

The FSF region 117 may be formed using one of amorphous silicon, amorphous silicon oxide (a-SiOx), and amorphous silicon carbide (a-SiC).

When the FSF region 117 is formed using the above material, a potential barrier is formed by a difference between impurity concentrations of the crystalline semiconductor substrate 111 and the FSF region 117. Hence, an electric effect may be obtained to prevent or reduce the movement of carriers (for example, holes) to the front surface of the crystalline semiconductor substrate 111.

Amorphous silicon oxide (a-SiOx) and amorphous silicon carbide (a-SiC) generally have energy band gaps of about 2.1 and about 2.8, respectively. Thus, the energy band gaps of amorphous silicon oxide (a-SiOx) and amorphous silicon carbide (a-SiC) are greater than amorphous silicon having an energy band gap of about 1.7 to 1.9.

When the FSF region 117 is formed of amorphous silicon oxide (a-SiOx) or amorphous silicon carbide (a-SiC), an amount of light absorbed in the FSF region 117 decreases. Hence, an amount of light incident on the crystalline semiconductor substrate 111 further increases.

The anti-reflection layer 118 positioned on the FSF region 117 reduces a reflectance of light incident on the back contact solar cell 110 and increases selectivity of a predetermined wavelength band, thereby increasing the efficiency of the back contact solar cell 110.

The anti-reflection layer 118 may be formed of silicon nitride (SiNx) or silicon oxide (SiOx), etc. The anti-reflection layer 118 may have a single-layered structure or a multi-layered structure. The anti-reflection layer 118 may be omitted, if desired.

The back protective layer 116b is positioned directly on the back surface of the crystalline semiconductor substrate 111 and performs the passivation function in the same manner as the front protective layer 116a, thereby preventing or reducing a recombination and/or a disappearance of carriers moving to the back surface of the crystalline semiconductor substrate 111.

The back protective layer 116b may be formed of amorphous silicon in the same manner as the front protective layer 116a.

The back protective layer 116b has a thickness such that carriers moving to the back surface of the crystalline semiconductor substrate 111 may pass through the back protective layer 116b and then may move to the emitter regions 119a or the BSF regions 119b.

When the thickness of the back protective layer 116b is equal to or greater than about 1 nm, the back protective layer 116b is uniformly coated on the back surface of the crystalline semiconductor substrate 111, thereby further increasing the passivation effect. When the thickness of the back protective layer 116b is equal to or less than about 10 nm, an amount of light, which passes through the crystalline semiconductor substrate 111 and then is absorbed in the back protective layer 116b, is reduced. Hence, an amount of light again incident on the crystalline semiconductor substrate 111 may increase.

Thus, the back protective layer 116b may have the thickness of about 1 nm to 10 nm.

Each of the plurality of BSF regions 119b is a region which is more heavily doped than the crystalline semiconductor substrate 111 with impurities of the same conductive type (for example, the n-type) as the crystalline semiconductor substrate 111. For example, each BSF region 119b may be an n$^+$-type region.

The plurality of BSF regions 119b are separated from one another on the back protective layer 116b and extend parallel to one another in a fixed direction. In the embodiment of the invention, the BSF regions 119b may be formed of non-crystalline semiconductor such as amorphous silicon.

Similar to the FSF region 117, the BSF regions 119b prevent or reduce the movement of holes to the BSF regions 119b and make it easier for electrons to move to the BSF regions 119b using a potential barrier formed by a difference between impurity concentrations of the crystalline semiconductor substrate 111 and the BSF regions 119b.

Accordingly, the BSF regions 119b reduce an amount of carriers lost by a recombination and/or a disappearance of electrons and holes at and around the BSF regions 119b or at a first electrode part (112, 114) and a second electrode part (113, 115) and accelerate a movement of electrons, thereby increasing an amount of electrons moving to the BSF regions 119b.

In the embodiment of the invention, the first electrode part includes the plurality of first electrodes 112 and the first electrode current collector 114, and the second electrode part includes the plurality of second electrodes 113 and the second electrode current collector 115.

Each of the BSF regions 119b may have a thickness of about 10 nm to 25 nm. When the thickness of the BSF region 119b is equal to or greater than about 10 nm, the potential barrier preventing the movement of holes may be formed more smoothly. Hence, a loss of carriers may be further reduced. When the thickness of the BSF region 119b is equal to or less than about 25 nm, an amount of light absorbed in the BSF region 119b decreases. Hence, an amount of light again incident on the crystalline semiconductor substrate 111 may increase.

The plurality of emitter regions 119a are separated from the plurality of BSF regions 119b at the back surface of the crystalline semiconductor substrate 111 and extend parallel to the plurality of BSF regions 119b.

Thus, as shown in FIG. 2, the plurality of emitter regions 119a and the plurality of BSF regions 119b are alternately positioned at the back surface of the crystalline semiconductor substrate 111.

Each of the plurality of emitter regions 119a positioned at the back surface of the crystalline semiconductor substrate 111 is of a second conductive type (for example, p-type) opposite the first conductive type (for example, n-type) of the crystalline semiconductor substrate 111. The emitter region 119a contains a semiconductor different from the crystalline semiconductor substrate 111, for example, amorphous silicon.

Thus, the emitter regions 119a and the crystalline semiconductor substrate 111 form heterojunction as well as a p-n junction.

According to the above-described configuration of the back contact solar cell 110, carriers (i.e., electron-hole pairs) produced by light incident on the crystalline semiconductor substrate 111 are separated into electrons and holes by a built-in potential difference resulting from the p-n junction between the crystalline semiconductor substrate 111 and the emitter regions 119a. Then, the separated electrons move to the n-type semiconductor, and the separated holes move to the p-type semiconductor.

Thus, when the crystalline semiconductor substrate 111 is of the n-type and the emitter regions 119a are of the p-type, the separated holes pass through the back protective layer 116b and move to the emitter regions 119a. Further, the separated electrons pass through the back protective layer 116b and move to the BSF regions 119b having an impurity concentration higher than the crystalline semiconductor substrate 111.

Each of the plurality of emitter regions 119a may have a thickness of about 5 nm to 15 nm. When the thickness of the emitter region 119a is equal to or greater than about 5 nm, the p-n junction may be formed more smoothly. When the thickness of the emitter region 119a is equal to or less than about 15 nm, an amount of light absorbed in the emitter regions 119a decreases. Hence, an amount of light again incident on the crystalline semiconductor substrate 111 may increase.

The back protective layer 116b is formed of intrinsic amorphous silicon (a-Si), in which there are no impurities or impurities scarcely exist, and is positioned under the emitter regions 119a and the BSF regions 119b. Therefore, the emitter regions 119a and the BSF regions 119b are not positioned directly on the crystalline semiconductor substrate 111 and are positioned on the back protective layer 116b. As a result, a crystallization phenomenon is reduced.

Further, characteristics of the emitter regions 119a and the BSF regions 119b positioned on the intrinsic amorphous silicon layer (i.e., the back protective layer 116b) are improved.

The plurality of first electrodes 112 respectively contacting the plurality of emitter regions 119a extend along the emitter regions 119a in a second direction X-X' and are electrically connected to the emitter regions 119a. The first electrodes 112 collect carriers (for example, holes) moving to the emitter regions 119a.

The plurality of second electrodes 113 respectively contacting the plurality of BSF regions 119b extend along the BSF regions 119b in the second direction X-X' and are electrically connected to the BSF regions 119b. The second electrodes 113 collect carriers (for example, electrons) moving to the BSF regions 119b.

The plurality of first and second electrodes 112 and 113 may be formed of at least one conductive material selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be formed.

The emitter regions 119a are positioned even in a formation area of the first electrode current collector 114 and the BSF regions 119b are positioned even in a formation area of the second electrode current collector 115.

The first electrode current collector 114 contacts the emitter regions 119a and is electrically connected to the emitter regions 119a. The first electrode current collector 114 is positioned at a first edge of the crystalline semiconductor substrate 111 and extends in a first direction Y-Y' perpendicular to the second direction X-X'. Hence, the first electrode current collector 114 physically connects first ends of the plurality of first electrodes 112 to one another.

The second electrode current collector 115 contacts the BSF regions 119b and is electrically connected to the BSF regions 119b. The second electrode current collector 115 is positioned at a second edge of the crystalline semiconductor substrate 111 and extends in the first direction Y-Y'. Hence, the second electrode current collector 115 physically connects first ends of the plurality of second electrodes 113 to one another.

Accordingly, the first electrode current collector 114 collects carriers moving to the first electrodes 112, and the second electrode current collector 115 collects carriers moving to the second electrodes 113.

The first electrode current collector 114 and the second electrode current collector 115 may be formed of the same material as the first electrodes 112 and the second electrodes 113.

FIG. 3 is a cross-sectional view of a configuration of a back contact solar cell 210 used in a solar cell module according to another example embodiment of the invention.

The solar cell 210 includes a first conductive type semiconductor substrate 211, a front passivation layer 216a formed in one surface (for example, a light receiving surface) of the semiconductor substrate 211, an anti-reflection layer 218 formed on the front passivation layer 216a, a first doped region 219a that is formed in other surface of the semiconductor substrate 211 and is heavily doped with first conductive type impurities, a second doped region 219b that is formed in the other surface of the semiconductor substrate 211 at a location adjacent to the first doped region 219a and is heavily doped with second conductive type impurities opposite the first conductive type impurities, a back passivation layer 216b exposing a portion of each of the first doped region 219a and the second doped region 219b, a first electrode 212 and a first electrode current collector electrically connected to the exposed portion of the first doped region 219a, and a second electrode 213 and a second electrode current collector electrically connected to the exposed portion of the second doped region 219b.

The front passivation layer 216a formed in the light receiving surface of the semiconductor substrate 211 is a region that is more heavily doped with impurities of a group V element such as phosphorus (P), arsenic (As), and antimony (Sb) than the semiconductor substrate 211. The front passivation layer 216a serves as a front surface field (FSF) layer similar to a back surface field (BSF) layer. Thus, a recombination and/or a disappearance of electrons and holes separated by incident light around the light receiving surface of the semiconductor substrate 211 are prevented or reduced.

The anti-reflection layer 218 on the surface of the front passivation layer 216a is formed of silicon nitride (SiNx) and/or silicon dioxide ($SiO_2$).

The first doped region 219a formed in the other surface of the semiconductor substrate 211 is a region that is more heavily doped with n-type impurities than the semiconductor substrate 211, and the second doped region 219b formed in the other surface of the semiconductor substrate 211 is a p-type heavily doped region. Thus, the p-type second doped region 219b and the n-type semiconductor substrate 211 form a p-n junction.

The first doped region 219a and the second doped region 219b serve as a moving path of carriers (electrons and holes) and respectively collect electrons and holes.

The back passivation layer 216b exposing a portion of each of the first doped region 219a and the second doped region 219b is formed of silicon nitride (SiNx), silicon dioxide ($SiO_2$), or a combination thereof. The back passivation layer 216b prevents or reduces a recombination and/or a disappearance of electrons and holes separated from carriers and reflects incident light to the inside of the solar cell so that the incident light is not reflected to the outside of the solar cell. Namely, the back passivation layer 216b prevents a loss of the incident light and reduces a loss amount of the incident light.

The back passivation layer 216b may have a single-layered structure or a multi-layered structure such as a double-layered structure or a triple-layered structure.

The first electrode 212 is formed on the first doped region 219a not covered by the back passivation layer 216b and on a portion of the back passivation layer 216b adjacent to the first doped region 219a not covered by the back passivation layer 216b. The second electrode 213 is formed on the second doped region 219b not covered by the back passivation layer 216b and on a portion of the back passivation layer 216b adjacent to the second doped region 219b not covered by the back passivation layer 216b.

Thus, the first electrode 212 is electrically connected to the first doped region 219a, and the second electrode 213 is electrically connected to the second doped region 219b.

As described above, because a portion of each of the first and second electrodes 212 and 213 overlaps a portion of the back passivation layer 216b and is connected to a bus bar area, a contact resistance and a series resistance generated when the first and second electrodes 212 and 213 contact an external driving circuit, etc., decrease. Hence, the efficiency of the solar cell is improved.

The back sheet 160 prevents moisture and oxygen from penetrating into a back surface of the solar cell module, thereby protecting the back contact solar cells 110 from an external environment. The back sheet 160 may have a multi-layered structure including a moisture/oxygen penetrating prevention layer, a chemical corrosion prevention layer, an insulation layer, etc.

The front encapsulant 130 and the back encapsulant 140 are respectively positioned on and under the back contact solar cells 110 and are attached to one another, thereby forming an integral body along with the back contact solar cells 110. Hence, the front encapsulant 130 and the back encapsulant 140 prevent corrosion of the back contact solar cells 110 resulting from the moisture penetration and protect the back contact solar cells 110 from an impact.

In the embodiment of the invention, the front encapsulant 130 and the back encapsulant 140 may be formed of the same material.

For example, the front encapsulant 130 and the back encapsulant 140 may be formed of a material (for example, cured siloxane containing polydimethylsiloxane (PDMS)) cured by performing a thermal processing on a liquid compound.

When the liquid compound, i.e., liquid siloxane is coated on the back contact solar cells 110, a portion of coated siloxane precursor is filled in a space between the back contact solar cells 110 due to its liquidity and is cured through the thermal processing.

Alternatively, the front encapsulant 130 and the back encapsulant 140 may be formed of a material manufactured in a film type, for example, ethylene vinyl acetate (EVA).

Further, the front encapsulant 130 and the back encapsulant 140 may be formed of different materials.

For example, the front encapsulant 130 may be formed of film type EVA, and the back encapsulant 140 may be formed of cured siloxane.

The transparent member 150 positioned on the front encapsulant 130 is formed of a tempered glass having a high transmittance of light to thereby prevent a damage of the solar cell module. The tempered glass may be a low iron tempered glass containing a small amount of iron. The transparent member 150 may have an embossed inner surface so as to increase a scattering effect of light.

The interconnector 120 is formed of a conductive metal and electrically connects the adjacent solar cells 110 to each other. The interconnector 120 may be formed of a conductive metal of a lead-free material containing lead (Pb) equal to or less than about 1,000 ppm. Alternatively, the interconnector 120 may include a solder formed of a Pb-containing material coated on the surface of the conductive metal.

The interconnector 120 contacts a conductive adhesive film, so as to electrically connect the adjacent solar cells 110 to each other.

In the embodiment of the invention, the conductive adhesive film includes a first conductive adhesive film CF1 contacting the first electrode current collector 114 and a second conductive adhesive film CF2 contacting the second electrode current collector 115.

A bonding structure between the interconnector and the current collector is described in detail below.

The first conductive adhesive film CF1 is positioned on the first electrode current collector 114, and the second conductive adhesive film CF2 is positioned on the second electrode current collector 115.

The first conductive adhesive film CF1 includes a resin CF1-1 and a plurality of conductive particles CF1-2 distributed in the resin CF1-1.

A material of the resin CF1-1 is not particularly limited as long as it has the adhesive property. It is preferable, but not required, that a thermosetting resin is used for the resin CF1-1 so as to increase the adhesive reliability.

The thermosetting resin may use at least one selected among epoxy resin, phenoxy resin, acryl resin, polyimide resin, and polycarbonate resin.

The resin CF1-1 may further contain a predetermined material, for example, a known curing agent and a known curing accelerator other than the thermosetting resin.

For example, the resin CF1-1 may contain a reforming material such as a silane-based coupling agent, a titanate-based coupling agent, and an aluminate-based coupling agent, so as to improve an adhesive strength between the first electrode current collector 114 and the interconnector 120.

The resin CF1-1 may contain a dispersing agent, for example, calcium phosphate and calcium carbonate, so as to improve the dispersibility of the conductive particles CF1-2. The resin CF1-1 may contain a rubber component such as acrylic rubber, silicon rubber, and urethane rubber, so as to control the modulus of elasticity of the first conductive adhesive film CF1.

A material of the conductive particles CF1-2 is not particularly limited as long as it has the conductivity.

The conductive particles CF1-2 may include radical metal particles of various sizes. In the embodiment of the invention, 'the radical metal particles' are metal particles of a nearly spherical shape which contain at least one metal selected among copper (Cu), silver (Ag), gold (Au), iron (Fe), nickel (Ni), lead (Pb), zinc (Zn), cobalt (Co), titanium (Ti), and magnesium (Mg) as the main component and each have a plurality of protrusions non-uniformly formed on its surface.

The first conductive adhesive film CF1 may include at least one radical metal particle having the size greater than a thickness of the resin CF1-1, so that a current smoothly flows between the first electrode current collector 114 and the interconnector 120.

According to the above-described configuration of the first conductive adhesive film CF1, a portion of the radical metal particle having the size greater than the thickness of the resin CF1-1 is buried in the first electrode current collector 114 and/or the interconnector 120.

Accordingly, a contact area between the radical metal particle and the first electrode current collector 114 and/or a contact area between the radical metal particle and the interconnector 120 increase, and a contact resistance decreases. The reduction in the contact resistance makes the current flow between the first electrode current collector 114 and the interconnector 120 smooth.

So far, the embodiment of the invention, in which the radical metal particles are used as the conductive particles CF1-2, was described. However, the conductive particles CF1-2 may be metal-coated resin particles containing at least one metal selected among copper (Cu), silver (Ag), gold (Au), iron (Fe), nickel (Ni), lead (Pb), zinc (Zn), cobalt (Co), titanium (Ti), and magnesium (Mg) as the main component.

When the conductive particles CF1-2 are the metal-coated resin particles, each of the conductive particles CF1-2 may have a circle shape or an oval shape.

The conductive particles CF1-2 may physically contact one another.

It is preferable, but not required, that a composition amount of the conductive particles CF1-2 distributed in the resin CF1-1 is about 0.5% to 20% based on the total volume of the first conductive adhesive film CF1 in consideration of the connection reliability after the resin CF1-1 is cured.

When the composition amount of the conductive particles CF1-2 is less than about 0.5%, the current may not smoothly flow because of a reduction in a physical contact area between the first electrode current collector 114 and the conductive particles CF1-2. When the composition amount of the conductive particles CF1-2 is greater than about 20%, the adhesive strength between the first electrode current collector 114 and the interconnector 120 may be reduced because a composition amount of the resin CF1-1 relatively decreases.

The first conductive adhesive film CF1 is attached to the first electrode current collector 114 in a direction parallel to the first electrode current collector 114.

A tabbing process is used to bond the first electrode current collector 114 to the interconnector 120. The tabbing process includes a pre-bonding process for bonding the first conductive adhesive film CF1 to the first electrode current collector 114 and a final-bonding process for bonding the first conductive adhesive film CF1 to the interconnector 120.

When the tabbing process is performed using the first conductive adhesive film CF1, a heating temperature and a pressure of the tabbing process are not particularly limited as long as they are set within the range capable of securing an electrical connection and maintaining the adhesive strength.

For example, the heating temperature in the pre-bonding process may be set to be equal to or less than about 100° C., and the heating temperature in the final-bonding process may be set to a curing temperature of the resin CF1-1, for example, about 140° C. to 180° C.

Further, the pressure in the pre-bonding process may be set to about 1 MPa. The pressure in the final-bonding process may be set to a range capable of sufficiently bonding the first electrode current collector 114 and the interconnector 120 to the first conductive adhesive film CF1, for example, about 2 MPa to 3 MPa.

In this instance, the pressure in the final-bonding process may be set so that at least a portion of the conductive particles CF1-2 is buried in the first electrode current collector 114 and/or the interconnector 120.

Time required to apply heat and pressure in the pre-bonding process may be set to about 5 seconds. Time required to apply heat and pressure in the final-bonding process may be set to the extent that the first electrode current collector 114, the interconnector 120, etc., are not damaged or deformed by heat, for example, about 10 seconds.

A width of the first conductive adhesive film CF1 in the second direction X-X' may be equal to or less than a width of the first electrode current collector 114, and a width of the second conductive adhesive film CF2 in the second direction X-X' may be equal to or less than a width of the second electrode current collector 115.

According to the above-described configuration of the conductive adhesive film, the first conductive adhesive film CF1 does not contact the first electrodes 112, and the second conductive adhesive film CF2 does not contact the second electrodes 113.

Further, the first conductive adhesive film CF1 does not contact the second electrodes 113, and the second conductive adhesive film CF2 does not contact the first electrodes 112.

A length of the first conductive adhesive film CF1 measured in the first direction Y-Y' may be equal to or less than a length of the first electrode current collector 114, and a length of the second conductive adhesive film CF2 measured in the first direction Y-Y' may be equal to or less than a length of the second electrode current collector 115.

A length of the interconnector 120 may be equal to or less than the length of the first conductive adhesive film CF1 and the length of the second conductive adhesive film CF2.

A width of the interconnector 120 may be greater than a distance between the adjacent first and second conductive adhesive films CF1 and CF2.

The width of the interconnector 120 may be properly set in consideration of an overlap area between the interconnector 120 and the first conductive adhesive film CF1 and an overlap area between the interconnector 120 and the second conductive adhesive film CF2.

The interconnector 120 may have slits or holes 122, so as to reduce a strain resulting from contraction and expansion by the heat.

When the back encapsulant 140 is formed of cured siloxane, the back encapsulant 140 may be filled in a space between the two adjacent back contact solar cells 110.

Alternatively, when the front encapsulant 130 and the back encapsulant 140 are formed of EVA or cured siloxane, the front encapsulant 130 may be filled in the space between the two adjacent back contact solar cells 110. Both the front encapsulant 130 and the back encapsulant 140 may be filled in the space depending on the material of the front encapsulant 130 and the back encapsulant 140.

Various modifications of the solar cell module shown in FIG. 4 are described below with reference to FIGS. 5 to 7.

Figure 5:
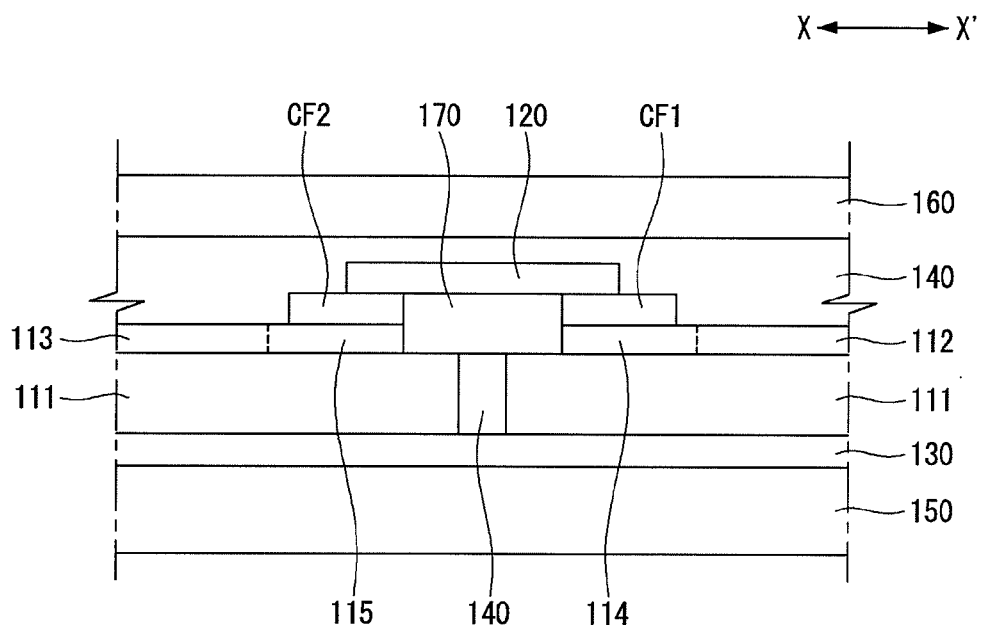
FIG. 5 is a partial cross-sectional view of a first modification of the solar cell module shown in FIG. 4.
Figure 6:
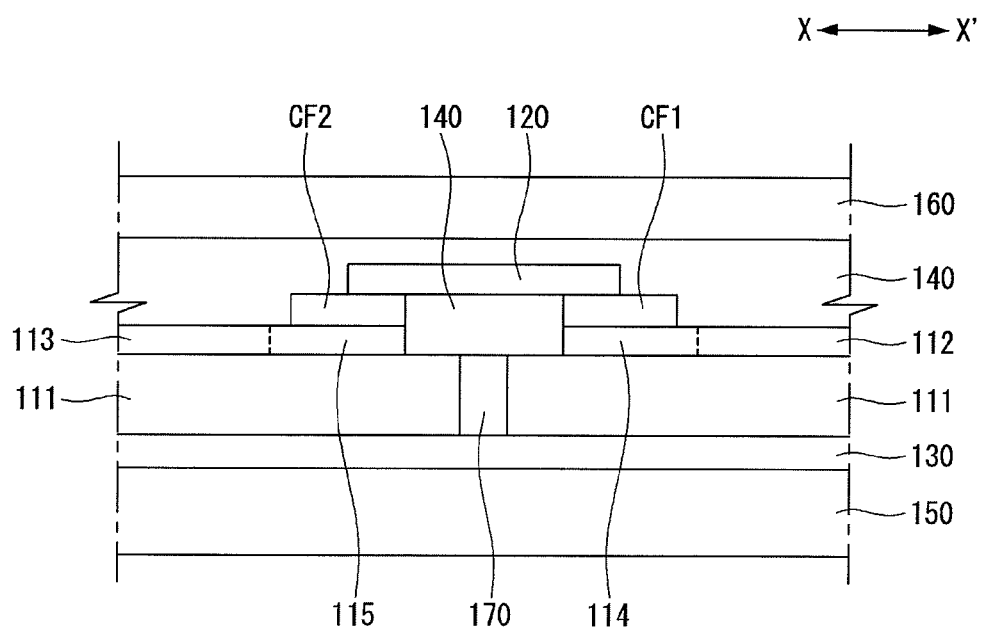
FIG. 6 is a partial cross-sectional view of a second modification of the solar cell module shown in FIG. 4.
Figure 7:
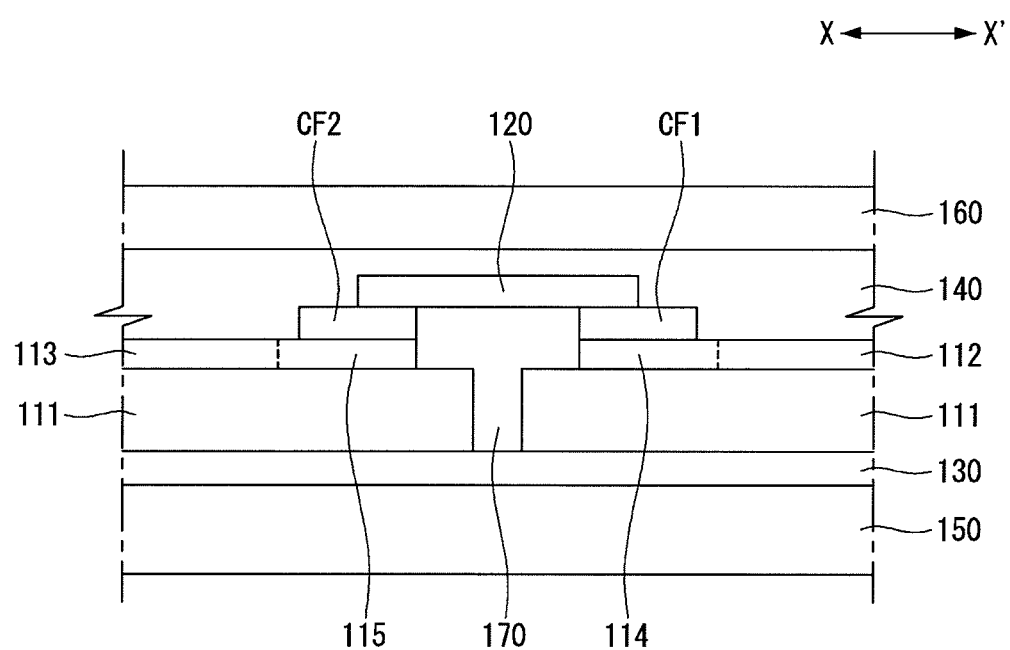
FIG. 7 is a partial cross-sectional view of a third modification of the solar cell module shown in FIG. 4.

Configurations of solar cell modules shown in FIGS. 5 to 7 are substantially the same as the solar cell module shown in FIG. 4, except that a spacer 170 is positioned between the two adjacent back contact solar cells 110. Thus, only the spacer 170 is described in the modifications illustrated in FIGS. 5 to 7. In the embodiment of the invention shown in FIG. 4, the back encapsulant 140 extends from the front encapsulant 130 to the interconnector 120.

As shown in FIG. 5, the spacer 170 may be positioned between the adjacent first and second electrode current collectors 114 and 115. In the embodiment of the invention shown in FIG. 5, the back encapsulant 140 extends from the front encapsulant 130 to the spacer 170, and the spacer 170 extends from the back encapsulant 140 to the interconnector 120. Alternatively, as shown in FIG. 6, the spacer 170 may be positioned between the two adjacent crystalline semiconductor substrates 111. In the embodiment of the invention shown in FIG. 6, the spacer 170 extends from the front encapsulant 130 to the back encapsulant 140, and the back encapsulant 140 extends from the spacer 170 to the interconnector 120. Alternatively, as shown in FIG. 7, the spacer 170 may be positioned between the two adjacent crystalline semiconductor substrates 111 and between the adjacent first and second electrode current collectors 114 and 115. In the embodiment of the invention shown in FIG. 7, the spacer 170 extends from the front encapsulant 130 to the interconnector 120.

As shown in FIG. 5, when the spacer 170 is positioned between the adjacent first and second electrode current collectors 114 and 115, the spacer 170 may have a thickness corresponding to a sum of the thickness of the first electrode current collector 114 and the thickness of the first conductive adhesive film CF1 or a sum of the thickness of the second electrode current collector 115 and the thickness of the second conductive adhesive film CF2. When the back encapsulant 140 is formed of cured siloxane, the back encapsulant 140 may be filled in a space between the two adjacent crystalline semiconductor substrates 111.

Alternatively, when the front encapsulant 130 and the back encapsulant 140 are formed of one of EVA and cured siloxane, the front encapsulant 130 may be filled in the space between the two adjacent crystalline semiconductor substrates 111. Both the front encapsulant 130 and the back encapsulant 140 may be filled in the space depending on the material of the front encapsulant 130 and the back encapsulant 140.

As shown in FIG. 6, when the spacer 170 is positioned between the two adjacent crystalline semiconductor substrates 111, the spacer 170 may have the same thickness as the crystalline semiconductor substrate 111. The back encapsulant 140 may be filled in a space between the spacer 170 and the interconnector 120.

Alternatively, the front encapsulant 130 or both the front encapsulant 130 and the back encapsulant 140 may be filled in the space between the spacer 170 and the interconnector 120.

As shown in FIG. 7, when the spacer 170 is positioned between the two adjacent crystalline semiconductor substrates 111 and between the adjacent first and second electrode current collectors 114 and 115, the spacer 170 may have a thickness corresponding to a sum of the thicknesses of the crystalline semiconductor substrate 111, the first electrode current collector 114, and the first conductive adhesive film CF1 or a sum of the thicknesses of the crystalline semiconductor substrate 111, the second electrode current collector 115, and the second conductive adhesive film CF2.

In the embodiment of the invention, the distance and the electrical insulation between the adjacent back contact solar cells 110 are carried out by the spacer 170. Thus, the interconnector 120 may be viewed through a space between the adjacent back contact solar cells 110 when viewed at a light receiving surface of the solar cell module.

The interconnector 120 is formed of conductive metal of a color different from the back contact solar cells 110. Thus, the surface of the spacer 170 toward the light receiving surface of the solar cell module may be processed in the same color (for example, black or white) as the crystalline semiconductor substrate 111 or the back sheet 160, so as to improve an appearance of the solar cell module.

The solar cell module having the above-described configuration may be manufactured by forming the front encapsulant 130 on the transparent member 150, disposing the plurality of back contact solar cells 110 on the front encapsulant 130 at a constant distance therebetween, respectively disposing the first conductive adhesive film CF1 and the second conductive adhesive film CF2 on the first electrode current collector 114 and the second electrode current collector 115, tabbing the interconnector 120 to the first and second conductive adhesive films CF1 and CF2, forming the back encapsulant 140 thereon, disposing the back sheet 160 on the back encapsulant 140, and performing a lamination process.

In this instance, the front encapsulant 130 and the back encapsulant 140 may be formed by coating and curing liquid siloxane precursor, for example, dimethylsilyl oxy acrylate.

When the liquid siloxane precursor is coated, a portion of the coated liquid siloxane precursor is filled in a space between the adjacent back contact solar cells 110.

Figure 8:
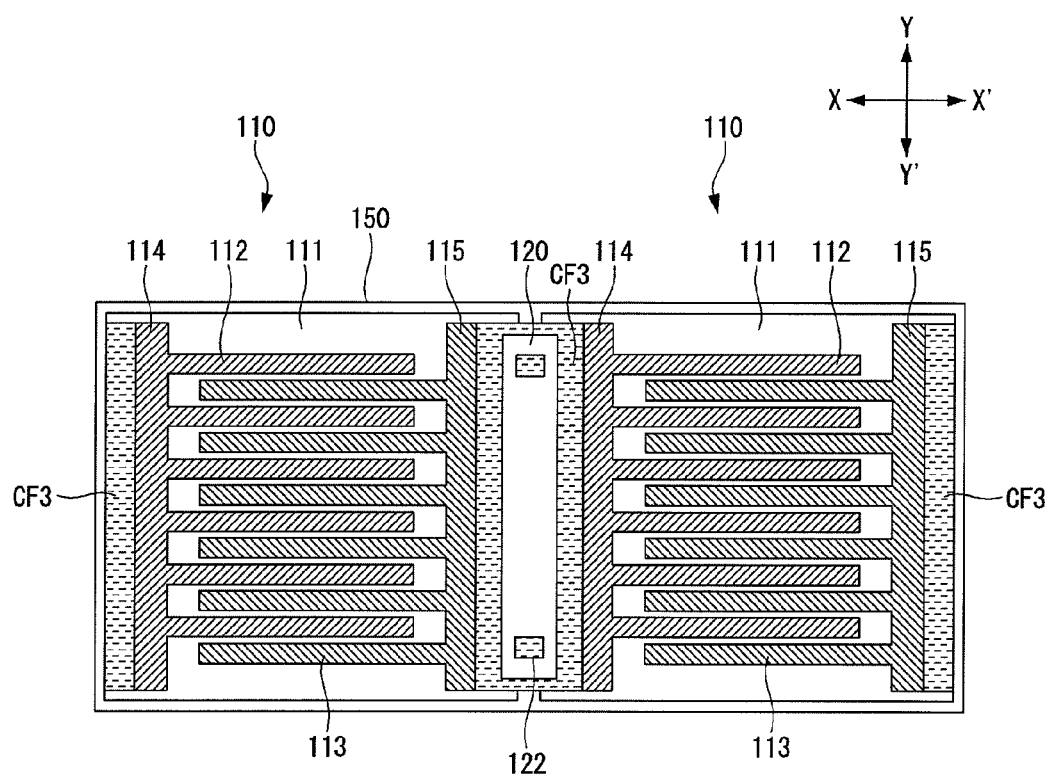
FIG. 8 is a plane view of a solar cell module according to a second embodiment of the invention in a state where a back sheet of the solar cell module is removed.

A solar cell module according to a second embodiment of the invention is described below with reference to FIGS. 8 and 9.

The first embodiment of the invention electrically connects the interconnector 120 to the first electrode current collector 114 using the first conductive adhesive film CF1 and also electrically connects the interconnector 120 to the second electrode current collector 115 using the second conductive adhesive film CF2.

On the other hand, the second embodiment of the invention electrically connects the interconnector 120 to the first and second electrode current collectors 114 and 115 using only a third conductive adhesive film CF3. Structures and components identical or equivalent to those in the first and second embodiments of the invention are designated with the same reference numerals, and a further description may be briefly made or may be entirely omitted.

In the second embodiment of the invention, a width of the third conductive adhesive film CF3 in the second direction X-X' may be equal to or greater than a width of the interconnector 120, and a length of the third conductive adhesive film CF3 in the first direction Y-Y' may be equal to or greater than a length of the interconnector 120.

Further, the third conductive adhesive film CF3 may not contact first and second electrodes 112 and 113, and the interconnector 120 may have slits or holes 122.

Figure 9:
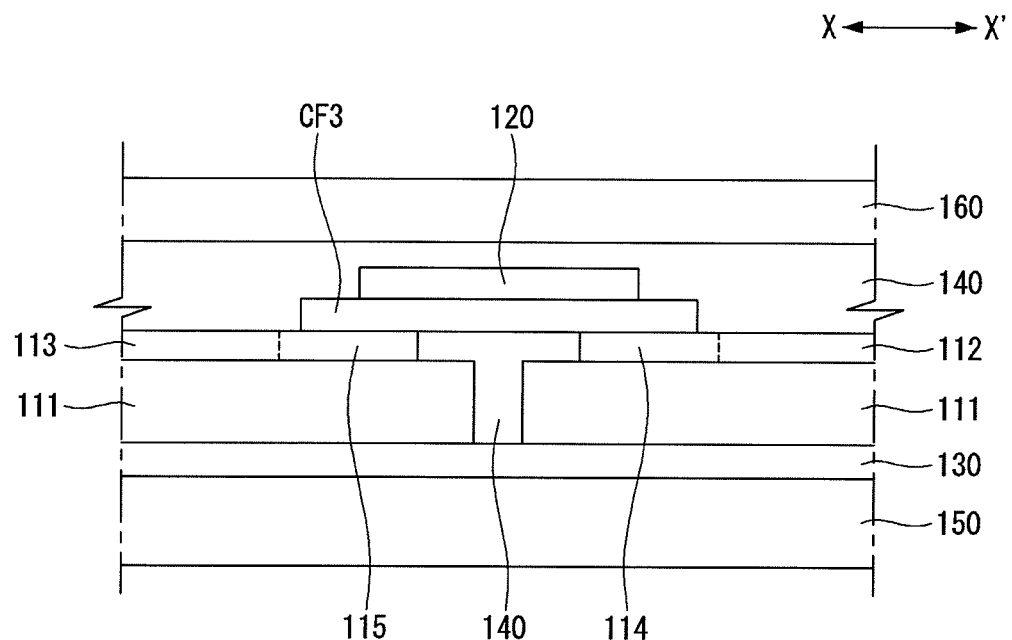
FIG. 9 is a partial cross-sectional view of the solar cell module according to the second embodiment of the invention.

Various modifications of the solar cell module shown in FIG. 9 are described below with reference to FIGS. 10 to 13.

In the solar cell module shown in FIG. 9, the back encapsulant 140 extends from the front encapsulant 130 to the third conductive adhesive film CF3.

Figure 10:
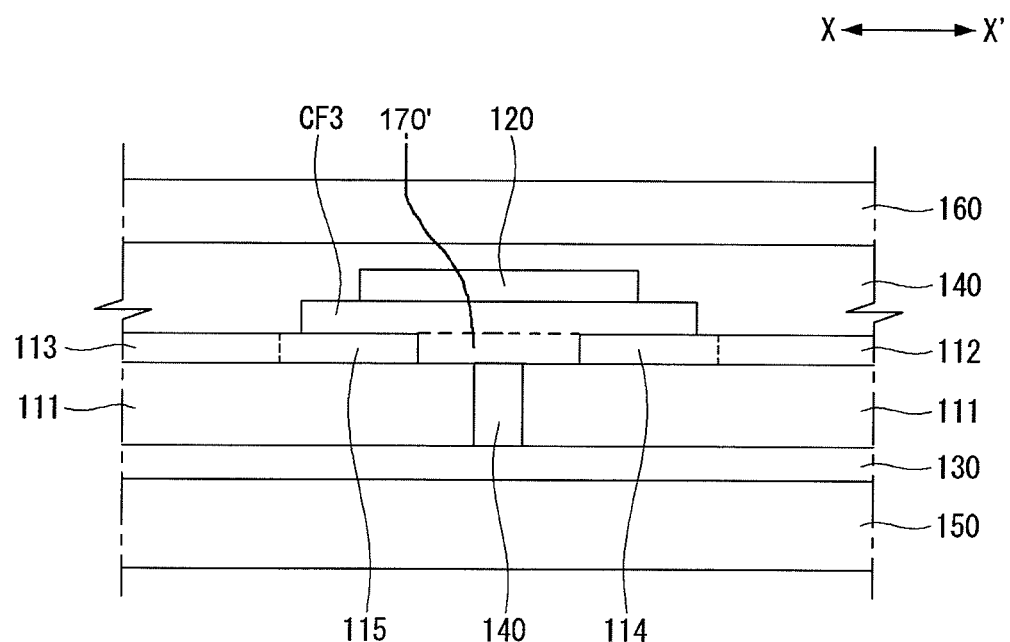
FIG. 10 is a partial cross-sectional view of a first modification of the solar cell module shown in FIG. 9.

In the solar cell module shown in FIG. 10, the third conductive adhesive film CF3 may include a space supporter 170' performing a function similar to the spacer 170 according to the first embodiment of the invention. The third conductive adhesive film CF3 and the space supporter 170' may form an integral body. The integral formation means the space supporter 170' is formed of the same material as the third conductive adhesive film CF3.

FIG. 10 shows that the space supporter 170' of the third conductive adhesive film CF3 contacts the crystalline semiconductor substrate 111. However, because the back protective layer 116b is positioned on the surface of the crystalline semiconductor substrate 111, the space supporter 170' does not directly contact the crystalline semiconductor substrate 111. In the solar cell module shown in FIG. 10, the back encapsulant 140 extends from the front encapsulant 130 to the space supporter 170', and the space supporter 170' extends from the back encapsulant 140 to the third conductive adhesive film CF3.

Alternatively, the solar cell module according to the second embodiment of the invention may include a spacer 170 in the same manner as the modifications of the first embodiment of the invention.

Figure 11:
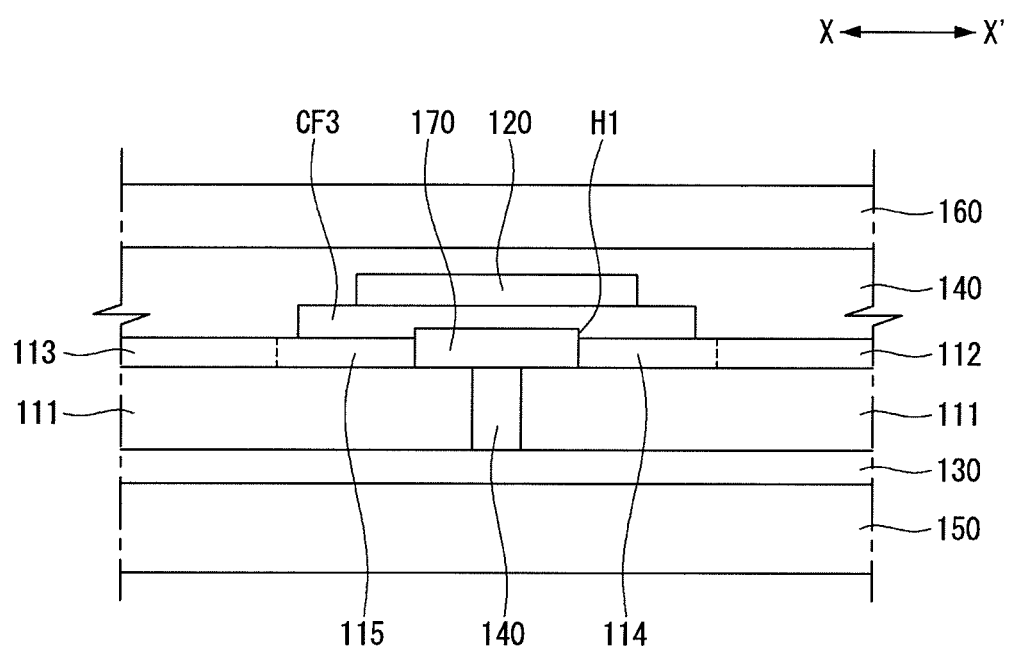
FIG. 11 is a partial cross-sectional view of a second modification of the solar cell module shown in FIG. 9.
Figure 12:
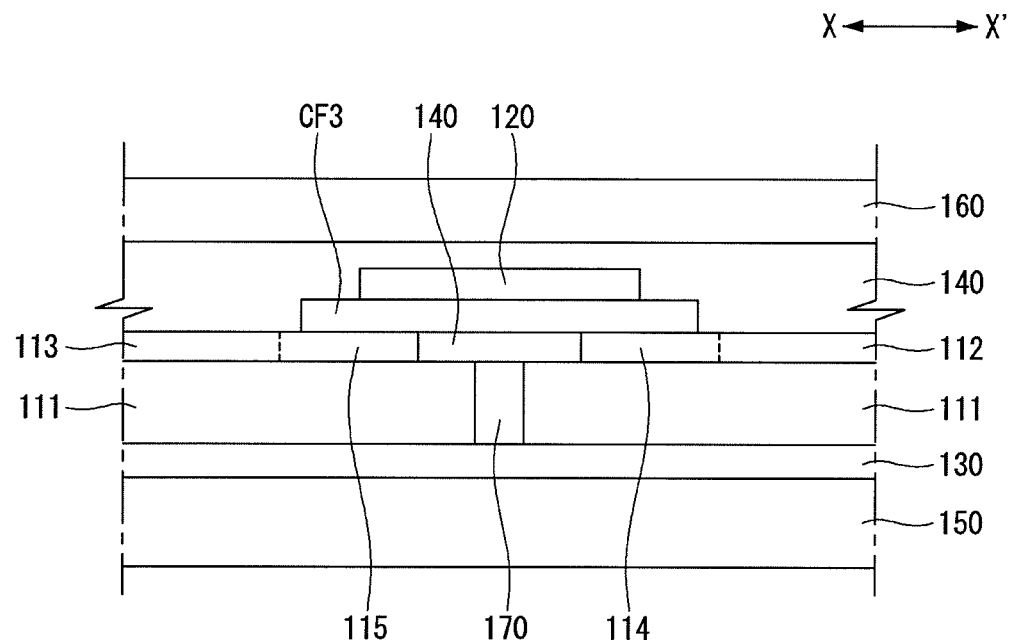
FIG. 12 is a partial cross-sectional view of a third modification of the solar cell module shown in FIG. 9.
Figure 13:
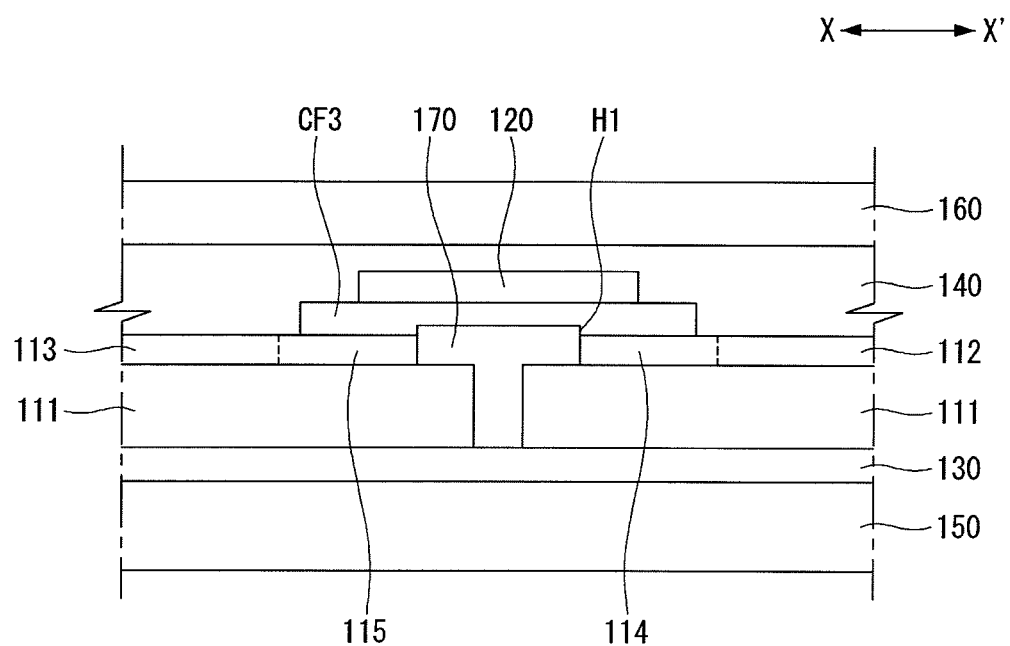
FIG. 13 is a partial cross-sectional view of a fourth modification of the solar cell module shown in FIG. 9.

As shown in FIG. 11, the spacer 170 may be positioned between the adjacent first and second electrode current collectors 114 and 115. In the solar cell module shown in FIG. 11, the back encapsulant 140 extends from the front encapsulant 130 to the spacer 170, and the spacer 170 extends from the back encapsulant 140 to the third conductive adhesive film CF3. Alternatively, as shown in FIG. 12, the spacer 170 may be positioned between the two adjacent crystalline semiconductor substrates 111. In the solar cell module shown in FIG. 12, the spacer 170 extends from the front encapsulant 130 to the back encapsulant 140, and the back encapsulant 140 extends from spacer 170 to the third conductive adhesive film CF3. Alternatively, as shown in FIG. 13, the spacer 170 may be positioned between the two adjacent crystalline semiconductor substrates 111 and between the adjacent first and second electrode current collectors 114 and 115. In the solar cell module shown in FIG. 13, the spacer 170 extends from the front encapsulant 130 to the third conductive adhesive film CF3.

As shown in FIG. 11, when the spacer 170 is positioned between the adjacent first and second electrode current collectors 114 and 115, a thickness of the spacer 170 may be substantially equal to a thickness of each of the first and second electrode current collectors 114 and 115 or may be greater than the thickness of each of the first and second electrode current collectors 114 and 115.

When the thickness of the spacer 170 is greater than the thickness of each of the first and second electrode current collectors 114 and 115, the third conductive adhesive film CF3 may have a groove H1 in which a portion of the spacer 170 is buried.

When the back encapsulant 140 is formed of cured siloxane, the back encapsulant 140 may be filled in a space between the two adjacent crystalline semiconductor substrates 111.

Alternatively, the front encapsulant 130 or both the front encapsulant 130 and the back encapsulant 140 may be filled in the space between the two adjacent crystalline semiconductor substrates 111.

As shown in FIG. 12, when the spacer 170 is positioned between the two adjacent crystalline semiconductor substrates 111, the spacer 170 may have the same thickness as the crystalline semiconductor substrate 111. The back encapsulant 140 may be filled in a space between the spacer 170 and the third conductive adhesive film CF3.

Alternatively, the front encapsulant 130 or both the front encapsulant 130 and the back encapsulant 140 may be filled in the space between the spacer 170 and the third conductive adhesive film CF3.

As shown in FIG. 13, when the spacer 170 is positioned between the two adjacent crystalline semiconductor substrates 111 and between the adjacent first and second electrode current collectors 114 and 115, a thickness of the spacer 170 may be equal to or greater than a sum of the thicknesses of the crystalline semiconductor substrate 111 and the first electrode current collector 114 and a sum of the thicknesses of the crystalline semiconductor substrate 111 and the second electrode current collector 115.

When the thickness of the spacer 170 is greater than the sum of the thicknesses of the crystalline semiconductor substrate 111 and the first electrode current collector 114 and the sum of the thicknesses of the crystalline semiconductor substrate 111 and the second electrode current collector 115, the third conductive adhesive film CF3 may have a groove H1 in which a portion of the spacer 170 is buried.

In the embodiment of the invention, the distance and the electrical insulation between the adjacent back contact solar cells 110 are carried out by the spacer 170. Thus, the interconnector 120 may be viewed through a space between the adjacent back contact solar cells 110 when viewed at a light receiving surface of the solar cell module.

The interconnector 120 is formed of conductive metal of a color different from the back contact solar cells 110. Thus, the surface of the spacer 170 toward the light receiving surface of the solar cell module may be processed in the same color (for example, black or white) as the crystalline semiconductor substrate 111 or the back sheet 160, so as to improve an appearance of the solar cell module.

Figure 14:
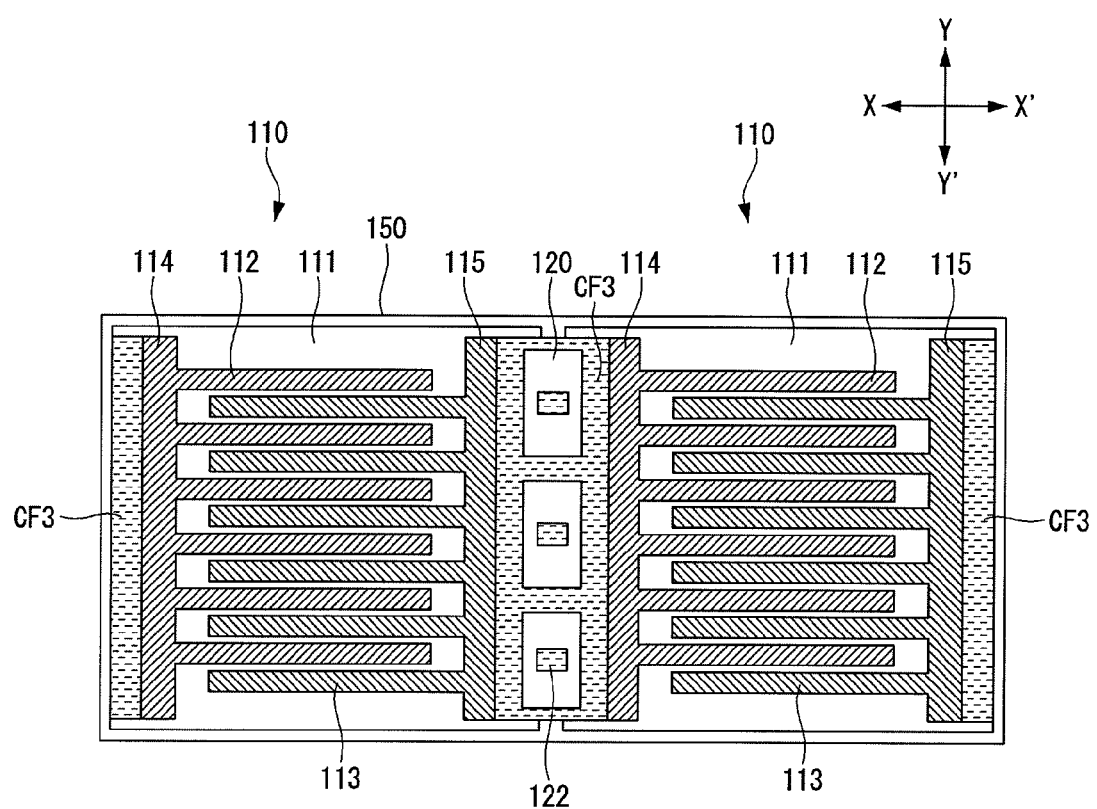
FIG. 14 is a plane view of a solar cell module according to a third embodiment of the invention in a state where a back sheet of the solar cell module is removed.

A solar cell module according to a third embodiment of the invention is described below with reference to FIG. 14. FIG. 14 is a plane view of a solar cell module according to a third embodiment of the invention in a state where a back sheet of the solar cell module is removed.

Configuration of the solar cell module according to the third embodiment of the invention is substantially the same as the solar cell module according to the second embodiment of the invention, except adjacent back contact solar cells 110 are electrically connected to each other using a plurality of interconnectors 120.

As shown in FIG. 14, a portion of a third conductive adhesive film CF3 contacts a second electrode current collector 115 of a back contact solar cell 110 positioned on a left side thereof. Further, another portion of the third conductive adhesive film CF3 contacts a first electrode current collector 114 of a back contact solar cell 110 positioned on a right side thereof.

At least two interconnectors 120 are positioned on the third conductive adhesive film CF3 in a longitudinal direction of the third conductive adhesive film CF3, i.e., in the first direction Y-Y'.

The third embodiment of the invention using at least two interconnectors 120 may be equally applied to the first embodiment of the invention.

For example, FIG. 14 shows that the three interconnectors 120 are attached to one third conductive adhesive film CF3.

Figure 15:
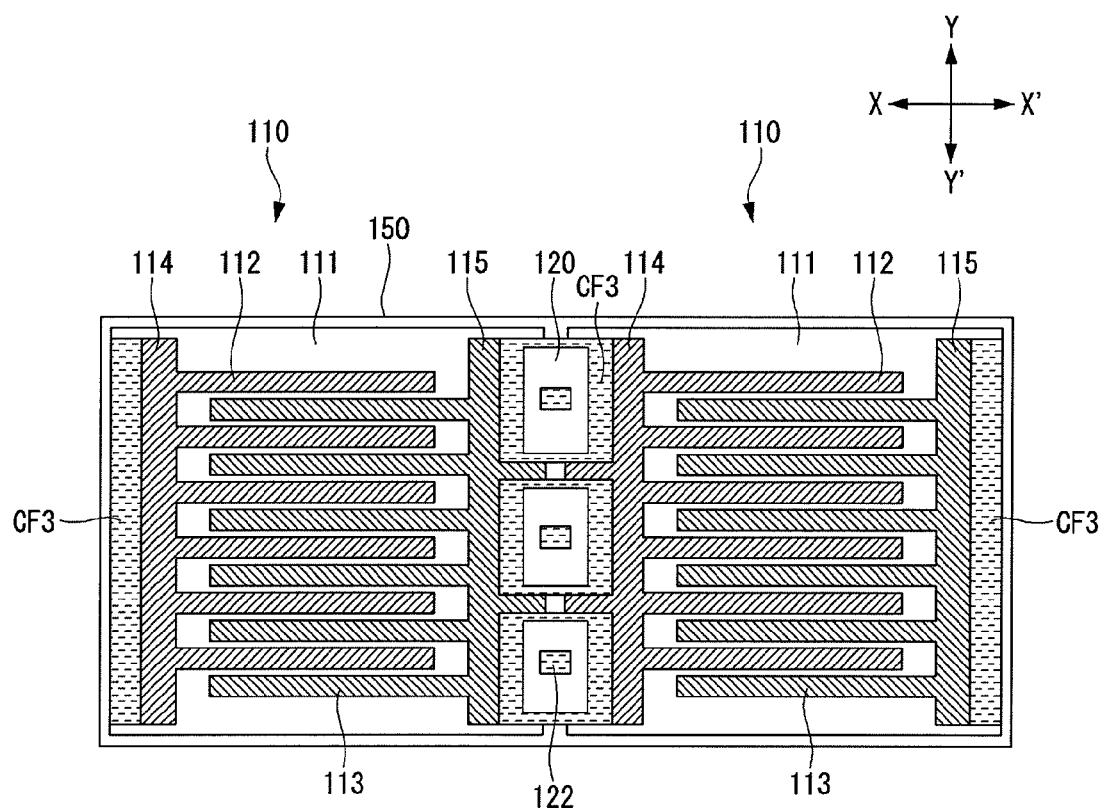
FIG. 15 is a plane view of a solar cell module according to a fourth embodiment of the invention in a state where a back sheet of the solar cell module is removed.

Alternatively, as shown in FIG. 15 showing a solar cell module according to a fourth embodiment of the invention, a third conductive adhesive film CF3 may be divided into a plurality of parts in the same manner as interconnectors 120.

In this instance, a second electrode current collector 115 of one back contact solar cell 110 may be electrically connected to a first electrode current collector 114 of another back contact solar cell 110 adjacent to the one back contact solar cell 110 using at least two third conductive adhesive films CF3 and the interconnectors 120 having the same number as the number of third conductive adhesive films CF3.

Figure 16:
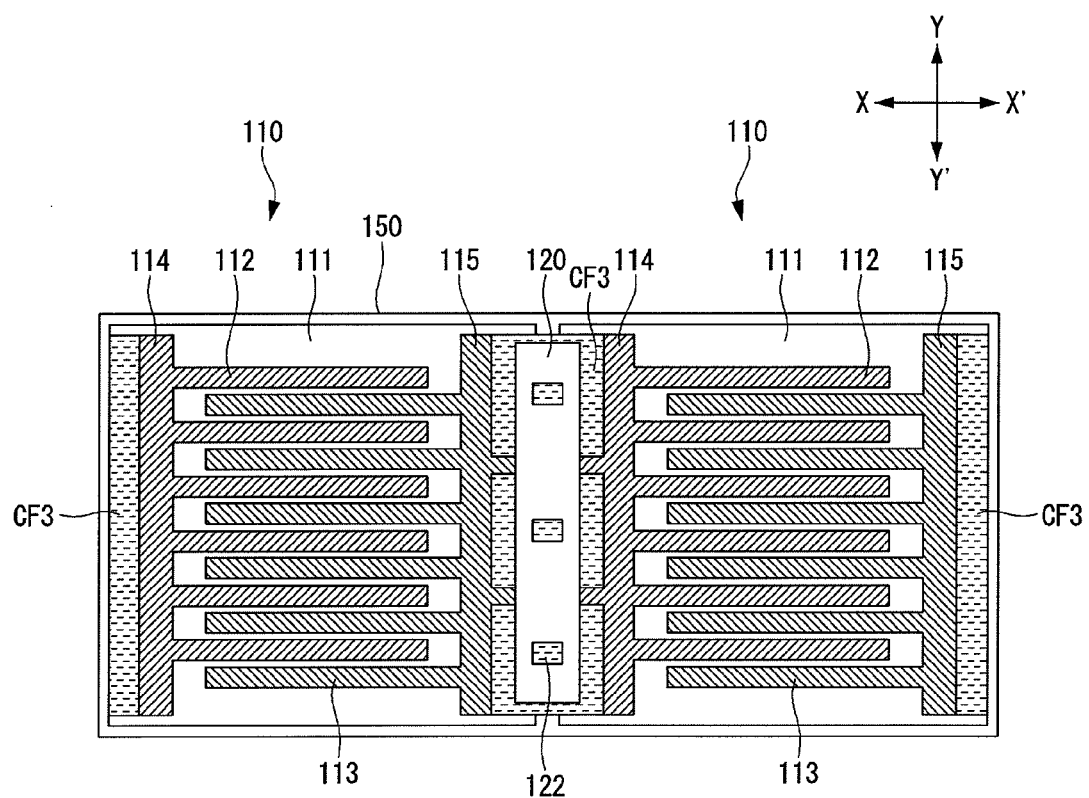
FIG. 16 is a plane view of a solar cell module according to a fifth embodiment of the invention in a state where a back sheet of the solar cell module is removed.

Alternatively, as shown in FIG. 16 showing a solar cell module according to a fifth embodiment of the invention, a second electrode current collector 115 of one back contact solar cell 110 and a first electrode current collector 114 of another back contact solar cell 110 adjacent to the one back contact solar cell 110 may contact at least two third conductive adhesive films CF3. Further, the at least two third conductive adhesive films CF3 may contact one interconnector 120.

Each of the back contact solar cells 110 used in the solar cell module according to the embodiments of the invention may have a non-bus bar structure in which there is no current collector, i.e., bus-bar.

In the back contact solar cell 110 of the non-bus bar structure, a first electrode part includes only a plurality of first electrodes extending in the second direction perpendicular to the first direction, and a second electrode part includes only a plurality of second electrodes extending in the second direction. Hence, the first electrodes and the second electrodes are alternately disposed.

In the back contact solar cell 110 of the non-bus bar structure, the first electrodes are not physically connected to one another because of an electrode material for forming the first electrodes, and the second electrodes are not physically connected to one another because of an electrode material for forming the second electrodes.

The back contact solar cell 110 of the non-bus bar structure may reduce the manufacturing cost and the number of manufacturing steps resulting from the formation of the bus bar.

In the back contact solar cell 110 of the non-bus bar structure, a conductive adhesive film physically contacts one end of each of the first electrodes or one end of each of the second electrodes, and thus electrically connects the ends of the first electrodes to one another or electrically connects the ends of the second electrodes to one another.

The one end of each first electrode and the one end of each second electrode may have a contact part of an extended width.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
a plurality of solar cells each including a single crystalline semiconductor substrate, an emitter region which is positioned on a back surface of the single crystalline semiconductor substrate and simultaneously forms a heterojunction and a p-n junction with the single crystalline semiconductor substrate, a back surface field region which is separated from the emitter region and is positioned on the back surface of the single crystalline semiconductor substrate, extends parallel to the emitter region and forms a heterojunction with the single crystalline semiconductor substrate, a plurality of first electrodes which are connected to the emitter region and extend in a first direction, a plurality of second electrodes which are connected to the back surface field region and extend in the first direction, a first electrode current collector which is positioned at a first edge of the back surface of the single crystalline semiconductor substrate and extends in a second direction perpendicular to the first direction, and a second electrode current collector which is positioned at a second edge of the back surface of the single crystalline semiconductor substrate and extends in the second direction;

a conductive adhesive film configured to contact with the first electrode current collector of a first solar cell of the plurality of solar cells, and with the second electrode current collector of a second solar cell adjacent to the first solar cell;

an interconnector configured to contact with the conductive adhesive film and electrically connect the first and second solar cells to each other;

a front encapsulant and a back encapsulant configured to protect the plurality of solar cells;

a transparent member positioned on the front encapsulant on front surfaces of the single crystalline semiconductor substrates of the plurality of solar cells; and a back sheet positioned under the back encapsulant on the back surfaces of the single crystalline semiconductor substrates of the plurality of solar cells;

wherein the conductive adhesive film includes a resin and a plurality of conductive particles distributed in the resin, wherein the conductive adhesive film having a first portion is positioned between the interconnector and the first electrode current collector, and the conductive adhesive film having a second portion is positioned between the interconnector and the second electrode current collector, wherein a width of the first portion of the conductive adhesive film which is connected to the first electrode current collector is less than a width of the first electrode current collector, and a width of an overlapping area of the interconnector and the first portion of the conductive adhesive film is less than the width of the first portion of the conductive adhesive film, wherein a width of the second portion of the conductive adhesive film which is connected to the second electrode current collector is less than a width of the second electrode current collector, and a width of an overlapping area of the interconnector and the second portion of the conductive adhesive film is less than the width of the second portion of the conductive adhesive film, and wherein the conductive adhesive film does not contact the plurality of first electrodes and the plurality of second electrodes.

2. The solar cell module of claim 1, wherein a length of the first portion of the conductive adhesive film is equal to or less than a length of the first electrode current collector, and a length of the second portion of the conductive adhesive film is equal to or less than a length of the second electrode current collector.

3. The solar cell module of claim 1, wherein first ends of the plurality of first electrodes being connected to the first electrode current collector, first ends of the plurality of second electrodes being connected to the second electrode current collector, and wherein the first portion of the conductive adhesive film does not contact the plurality of first electrodes, and the second portion of the conductive adhesive film does not contact the plurality of second electrodes.

4. The solar cell module of claim 1, wherein a length of the interconnector is equal to or less than a length of the first portion of the conductive adhesive film and a length of the second portion of the conductive adhesive film.

5. The solar cell module of claim 1, wherein a width of the interconnector is greater than a distance between adjacent ends of the first portion of the conductive adhesive film and the second portion of the conductive adhesive film.

6. The solar cell module of claim 1, wherein the conductive adhesive film contacts the first electrode current collector of the first solar cell and the second electrode current collector of the second solar cell, and extends from the first electrode current collector to the second electrode current collector.

7. The solar cell module of claim 6, wherein a width of the conductive adhesive film is equal to or greater than a width of the interconnector.

8. The solar cell module of claim 6, wherein a length of the interconnector is equal to or less than a length of the conductive adhesive film.

9. The solar cell module of claim 6, wherein first ends of the plurality of first electrodes being connected to the first electrode current collector, first ends of the plurality of second electrodes being connected to the second electrode current collector.

10. The solar cell module of claim 1, wherein the conductive adhesive film has a groove in which a portion of a spacer is buried.

11. The solar cell module of claim 1, further comprising a spacer maintaining a distance between the first and second solar cells.

12. The solar cell module of claim 11, wherein the spacer has substantially a same thickness as a thickness of the single crystalline semiconductor substrate.

13. The solar cell module of claim 11, wherein the spacer is positioned between each of the single crystalline semiconductor substrates of the first and second solar cells.

14. The solar cell module of claim 11, wherein a space between the spacer and the interconnector is filled with the front encapsulant or the back encapsulant.

15. The solar cell module of claim 11, wherein a thickness of a space between the spacer and the interconnector is equal to or greater than a sum of a thickness of the first electrode current collector and a thickness of the conductive adhesive film or a sum of a thickness of the second electrode current collector and the thickness of the conductive adhesive film.

* * * * *